(12) United States Patent
Schaedler et al.

(10) Patent No.: US 10,119,589 B2
(45) Date of Patent: Nov. 6, 2018

(54) MICROLATTICE DAMPING MATERIAL AND METHOD FOR REPEATABLE ENERGY ABSORPTION

(71) Applicant: HRL Laboratories, LLC, Malibu, CA (US)

(72) Inventors: Tobias A. Schaedler, Oak Park, CA (US); Alan J. Jacobsen, Woodland Hills, CA (US); William Carter, Calabasas, CA (US); Christopher P. Henry, Thousand Oaks, CA (US); Chia-Ming "Gavin" Chang, Agoura Hills, CA (US); Geoffrey P. McKnight, Los Angeles, CA (US); Andrew P. Nowak, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/156,242

(22) Filed: Jan. 15, 2014

(65) Prior Publication Data
US 2017/0307040 A1 Oct. 26, 2017

Related U.S. Application Data

(63) Continuation-in-part of application No. 13/584,108, filed on Aug. 13, 2012, now Pat. No. 9,415,562.
(Continued)

(51) Int. Cl.
*F16F 7/00* (2006.01)
*B32B 3/12* (2006.01)
(Continued)

(52) U.S. Cl.
CPC ................ *F16F 7/00* (2013.01); *B05D 1/00* (2013.01); *B32B 3/12* (2013.01); *B33Y 80/00* (2014.12);
(Continued)

(58) Field of Classification Search
CPC ........................................................ F16F 7/00
See application file for complete search history.

(56) References Cited

U.S. PATENT DOCUMENTS

| 3,694,325 A | 9/1972 | Greene et al. |
| 4,053,371 A | 10/1977 | Towsley |

(Continued)

FOREIGN PATENT DOCUMENTS

| EP | 1 685 786 | 8/2006 |
| EP | 1685786 A1 | 8/2006 |

(Continued)

OTHER PUBLICATIONS

Holnicki-Szulc et al., Vibration Mode Shape Control by Prestressing, Jul. 1992, AIAA Journal, vol. 30, No. 7, pp. 1924-1927.*
(Continued)

*Primary Examiner* — Jeffrey A Vonch
(74) *Attorney, Agent, or Firm* — Tope-McKay & Associates

(57) ABSTRACT

Described is a micro-lattice damping material and a method for repeatable energy absorption. The micro-lattice damping material is a cellular material formed of a three-dimensional interconnected network of hollow tubes. This material is operable to provide high damping, specifically acoustic, vibration or shock damping, by utilizing the energy absorption mechanism of hollow tube buckling, which is rendered repeatable by the micro-lattice architecture.

11 Claims, 17 Drawing Sheets

400

Related U.S. Application Data

(60) Provisional application No. 61/524,714, filed on Aug. 17, 2011, provisional application No. 61/753,848, filed on Jan. 17, 2013.

(51) Int. Cl.

| | | |
|---|---|---|
| *B81C 1/00* | (2006.01) | |
| *C04B 30/02* | (2006.01) | |
| *B05D 1/00* | (2006.01) | |
| *C25D 1/00* | (2006.01) | |
| *C23C 18/00* | (2006.01) | |
| *C23C 26/00* | (2006.01) | |
| *B33Y 80/00* | (2015.01) | |
| *B32B 3/10* | (2006.01) | |
| *B81B 3/00* | (2006.01) | |
| *C04B 111/40* | (2006.01) | |
| *C04B 111/52* | (2006.01) | |
| *C23C 16/00* | (2006.01) | |

(52) U.S. Cl.
CPC .......... *B81C 1/00126* (2013.01); *C04B 30/02* (2013.01); *C23C 18/00* (2013.01); *C23C 26/00* (2013.01); *C25D 1/00* (2013.01); *B32B 3/10* (2013.01); *B32B 2307/51* (2013.01); *B32B 2307/56* (2013.01); *B32B 2307/72* (2013.01); *B81B 3/007* (2013.01); *B81B 3/0035* (2013.01); *B81B 3/0067* (2013.01); *C04B 2111/40* (2013.01); *C04B 2111/52* (2013.01); *C23C 16/00* (2013.01); *Y10T 428/1234* (2015.01); *Y10T 428/12361* (2015.01); *Y10T 428/12375* (2015.01); *Y10T 428/12479* (2015.01); *Y10T 428/24149* (2015.01); *Y10T 428/24273* (2015.01); *Y10T 428/24661* (2015.01); *Y10T 428/249953* (2015.04); *Y10T 428/26* (2015.01)

(56) References Cited

U.S. PATENT DOCUMENTS

| | | |
|---|---|---|
| 4,390,599 A | 6/1983 | Broyles |
| 4,882,232 A | 11/1989 | Bugnet et al. |
| 7,129,183 B2 | 10/2006 | Mori et al. |
| 7,653,276 B1 | 1/2010 | Gross et al. |
| 2004/0123980 A1 | 7/2004 | Queheillalt et al. |
| 2006/0084942 A1 | 4/2006 | Kim et al. |
| 2010/0179288 A1 | 7/2010 | Leventis et al. |

FOREIGN PATENT DOCUMENTS

| | | |
|---|---|---|
| EP | 1 955 899 | 8/2008 |
| EP | 1955899 A1 | 8/2008 |
| WO | WO 95/00362 A1 | 6/1994 |
| WO | WO 05 00362 | 1/1995 |
| WO | WO 02/098644 A2 | 12/2000 |
| WO | 2013/025800 | 2/2013 |

OTHER PUBLICATIONS

Ebrahimi et al., Mechanical Properties of Nanocrystalline Nickel Produced by Electrodeposition, May 1999, Nanostructured Materials, vol. 11, Issue 3, pp. 343-350.*
Parkinson, Properties and applications of electroless nickel, Apr. 1997 (Year: 1997).*
M. F. Ashby, A. G. Evans, N. A. Fleck, L. J. Gibson, J. W. Hutchinson, H. N. G. Wadley, Metal Foams: A Design Guide (Butterworth-Heinemann, Burlington, MA 2000) p. 43.
T.A. Schaedler, A.J. Jacobsen, A. Torrents, A.E. Sorensen, J. Lian, J.R. Greer, L. Valdevit. W.B. Carter, Ultralight Metallic Microlattices, Science (2011).
A. Torrents, T. A. Schaedler, A. J. Jacobsen, W. B. Carter, L. Valdevit, Characterization of nickel-based micro-lattice materials with structural hierarchy from the nanometer to the millimeter scale, submitted to Acta Mat. 2011.
Gurit Holding AG, Core-Cell Datasheets, http://www.gurit.com/core-materials-datasheets.aspx , Oct. 7, 2012.
Gurit Holding AG, Balsa Wood Core Material, http://www.gurit.com/files/documents/balsaflexwev3pdf.pdf, Jun. 17, 2012.
L. J. Gibson, M. F. Ashby, Cellular Solids: Structure and Properties (Cambridge Univ. Press, Cambridge, UK, 1997) pp. 175-234.
A.J. Jacobsen, W.B. Carter, S. Nutt, Micro-scale Truss Structures formed from Self-Propagating Photopolymer Waveguides. Advanced Materials 19 3892-3896 (2007).
A.J. Jacobsen, W.B. Carter, S. Nutt, Compression behavior of micro-scale truss structures formed from self-propagating polymer waveguides. Acta Materialia 55 6724-6733 (2007).
Roper, C.S. "Multiobjective Optimization for Design of Multifunctional Sandwich Panel." International Journal of Heat and Fluid Flow (2010).
K.J. Maloney, K.D. Fink, T.A. Schaedler, J.A. Kolodziejska. A.J. Jacobsen, C.S. Roper, "Multifunctional heat exchangers derived from three-dimensional micro-lattice structures" International Journal of Heat and Mass Transfer 55 (2012) 2486-2493.
M. Xu, D.N. Futaba, T. Yamada, M. Yumura, K. Hate "Carbon Nanotubes with Temperature-Invariant Viscoelasticity from—196° to 1000° C" Science 330, 1364 (2010).
J.Zou, J. Liu, A. S. Karakoti, A. Kumar, D. Joung, Q. Li, S. I. Khondaker, S. Seal, L. Zhai, Ultralight Multiwalled Carbon Nanotube Aerogel, ACS Nano 4 7293-7302 (2010).
S.B. Hutchens, A. Needleman, J.R. Greer, "Analysis of uniaxial compression of vertically aligned carbon nanotubes" J. of the Mechanics and Physics of Solids, vol. 59, pp. 2227-2237 (2011).
S.-Y. Chang and T.-K. "Chang Grain size effect on nanomechanical properties and deformation behavior of copper under nanoindentation test" J. Appl. Phys. 101, 033537 (2007).
J. Lian. L. Valdevit, T. A. Schaedler, A.J. Jacobsen, W. Barvosa-Carter, J. R. Greer, Catastrophic vs. gradual collapse of thin-walled nanocrystalline Ni cylinders as building blocks of micro-lattice structures, Nano Letters 11 4118 (2011).
Plascore Inc. PAMG-XR1 5052 Aluminum Honeycomb, Datasheet, 2012, http://www.plascore.com/pdf/Plascore_5052.pdf.
L. J. Gibson, M. F. Ashby The Mechanics of Three-Dimensional Cellular Materials. Proc. R. Soc. Lond. A, 382 43-59 (1982).
Hexcel Corp., HexWeb™ Honeycomb Attributes and Properties, Datasheet, 1999; http://www.hexcel.com/Resources/DataSheets/Brochure-Data-Sheets/Honeycomb_Attributes_and_Properties.pdf.
Deshpande VS, Fleck NA. Ashby MF. J Mech Phys Solids 2001;49;1747.
Evans AG, Hutchinson JW, Fleck NA, Ashby MF, Wadley HNG. Prop Mater Sci 2001;46:309.
S. Kumar, M.T. Alam, and M. A Haque "Fatigue Insensitivity of Nanoscale Freestanding Aluminum Films" J. of Microelectromechanical Systems vol. 20, No. 1 p. 53 (2011).
J.J. Licari Coating Materials for Electronic Applications Noyes Publications, New Jersey, 2003 p. 157.
Handbook of Plastics, Elastomers and Composites, Chapter 6 "Plastics in Coatings and Finishes" 4th Edition, McGraw Hill, Inc. New York, 2002, pp. 345-395.
Hausmann, D.; Becker, J.; Wang, S.; Gordon, R. G. Science 2002, 298, 402-406.
Burton, B. B.; Boleslawski, M. P.; Desombre, A. T ; George, S M. Chem. Mater. 20, 7031-7043, 2008.
E.J. Kramer "Microscopic and molecular fundamentals of crazing" in Advances in Polymers Science vol. 52-53, 1983, pp. 1-56.
S. W. Godfrey, L. Valdevit, "Compressive strength of hollow microlattices: modeling and optimal design", J. Mater. Res. vol. 28, No. 17, Sep. 14, 2013.
Evans, A.G., He, M.Y., Deshpande, V.S., Hutchinson, J.W., Jacobsen, A. J., Carter, W.B., 2010, Concepts for enhanced energy absorption using hollow micro-lattices. International Journal of Impact Engineering 37, 947-959.

(56) References Cited

OTHER PUBLICATIONS

T.A. Schaedler, A.J. Jacobsen, A. Torrents, A.E. Sorensen, J. Lian, J.R. Greer, L. Valdevit. W.B. Carter, Ultralight Metallic Microlattices, Science (2011), vol. 334, pp. 962-965.

A. Torrents, T. A. Schaedler, A. J. Jacobsen, W. B. Carter, L. Valdevit, Characterization of nickel-based micro-lattice materials with structural hierarchy from the nanometer to the millimeter scale, Acta Materialia, 2012, vol. 60, pp. 3511-3523.

International Search Report and the Written Opinion of the International Searching Authority for PCT/US2014/011715; dated Oct. 21, 2014.

Guinness Book of World Records, Least Dense Solid, 2003. http://www.guinnessworldrecords.com/Search/Details/Least-dense-solid/47186.htm.

J.Zou, J. Liu, A. S. Karakoti, A. Kumar, D. Joung, Q. Li, S. I. Khondaker, S. Seal, L. Zhai, "Ultralight Multiwalled Carbon Nanotube Aerogel," ACS Nano 4 7293-7302 (2010).

A. Verdooren, H. M. Chan,w J. L. Grenestedt, M. P. Harmer, and H. S. Caram, "Fabrication of Low-Density Ferrous Metallic Foams by Reduction of Chemically Bonded Ceramic Foams," J. Am. Ceram. Soc. 89 3101-3106 (2006).

B. C. Tappan, M. H. Huynh, M. A. Hiskey, D. E. Chavez, E. P. Luther, J. T. Mang, S. F. Son, "Ultralow-Density Nanostructured Metal Foams: Combustion Synthesis, Morphology, and Composition," J. Am. Chem. Soc. 128 6589-6594 (2006).

BASF Corp., Materials Safety Data Sheet for Basotect V3012 (2007) http://www.basf.co.kr/02_products/01_thermoplastics/spe/documents/MSDS-Basotect%20V3012.pdf.

Hexcel Corp., HexWeb™ Honeycomb Attributes and Properties, (Datasheet, 1999). http://www.hexcel.com/Resources/DataSheets/Brochure-Data-Sheets/Honeycomb_Attributes_and_Properties_.pdf.

V. S. Deshpande, M. F. Ashby, N. A. Fleck, "Foam topology bending versus stretching dominated architectures," Acta Materialia. 49 1035-1040 (2001).

R. S. Lakes, "Materials with structural hierarchy." Nature 361 511-515 (1993).

A.J. Jacobsen, W.B. Carter, S. Nutt, "Compression behavior of micro-scale truss structures formed from self-propagating polymer waveguides." Acta Materialia 55 6724-6733 (2007).

A.J. Jacobsen, W.B. Carter, S. Nutt, "Micro-scale Truss Structures formed from Self-Propagating Photopolymer Waveguides." Advanced Materials 19 3892-3896 (2007).

A. J. Jacobsen, William Barvosa-Carter, Steven Nutt, "Micro-scale truss structures with three-fold symmetry formed from self-propagating polymer waveguides" Acta Materialia (2008), vol. 56, Publisher: Elsevier, pp. 2540-2548.

A.J. Jacobsen, W.B. Carter, S. Nutt, "Shear behavior of polymer micro-scale truss structures formed from self-propagating polymer waveguides." Acta Materialia 56 2540-2548 (2008).

S.H. Park, D. N. Lee, "A study on the microstructure and phase transformation of electroless nickel deposits." Journal of Materials Science 23 1643-1654 (1988).

J. Lian, L. Valdevit, T. A. Schaedler, A.J. Jacobsen, W. Barvosa-Carter, J. R. Greer, "Catastrophic vs. gradual collapse of thin-walled nanocrystalline Ni cylinders as building blocks of micro-lattice structures," Nano Letters 11 p. 4118 (2011).

S. Y. Chang, Y. S. Lee, H. L. Hsiao, T. K. Chang, "Mechanical properties and deformation behavior of amorphous nickel-phosphorous films measured by nanoindentation test." Metall Mater Trans A 37A 2939-2945 (2006).

L. G. Brazier, "On the Flexure of Thin Cylindrical Shells and Other "Thin" Sections," Proceedings of the Royal Society of London. Series A, 116, No. 773 (1927), pp. 104-114.

N.J. J Mills, "Finite Element Models for the viscoelasticity of open-cell polyurethane foam." Cellular Polymers 5 293-316 (2006).

A. Cao, P. L. Dickrell, W. G. Sawyer, M. N. Ghasemi-Nejhad, P. M. Ajayan, "Super-Compressible Foamlike Carbon Nanotube Films." Science 310 1307-1310 (2005).

J. R. Trelewicz, C. A. Schuh, "The Hall-Petch breakdown in nanocrystalline metals: A crossover to glass-like deformation." Acta Materialia 55 5948-5958 (2007).

G. F. Smits, "Effect of Cellsize Reduction on Polyurethane Foam Physical Properties Reduction." Journal of Building Physics 17 309-329 (1994).

Mecklenburg et al., Aerographite: "Ultra Lightweight, Flexible Nanowall, Carbon Microtube Material with Outstanding Mechanical Performance," Advanced Materials (2012).

Schaedler, T.A., Jacobsen, A.J., Torrents, A., Sorensen, A.E., Lian, J., Greer, J.R., Valdevit, L., Carter, W.B., (Nov. 2011), "Ultralight Metallic Microlattices." Science 334, 962-965.

Douglas T. Queheillalt, et al., "Synthesis of open-cell metal foams by templated directed vapor deposition", Journal of Materials Research, 2001, vol. 16, Issue 4: pp. 1028-1036.

L. J. Gibson, M. F. Ashby, Cellular Solids: Structure and Properties (Cambridge Univ. Press, Cambridge, UK, 1997), Chapter 5.

W. C. Young, R. G. Budynas, Roark's Formulas for Stress and Strain (McGraw-Hill, New York ed. Jul. 2002) p. 735.

J. E. Butler, A. V. Sumant, "The CVD of Nanodiamond Materials." Chem. Vap. Deposition 14 145-160 (2008).

M.F. Ashby, A. G. Evans, N. A. Fleck, L. J. Gibson, J. W. Hutchinson, H. N. G. Wadley, "Metal Foams: A Design Guide" (Butterworth-Heinemann, Burlington, MA, 2000) pp. 251, chapter 2 and 4.

Evans, et al., "Concepts for enhanced energy absorption using hollow micro-lattices," International Journal of Impact Engineering, vol. 37, No. 9, Apr. 2010 (Apr. 2010), pp. 947-959, XP055145047.

Bouwhuis, et al., "Mechanical properties of hybrid nanocrystalline metal foams," ACTA Materialia, vol. 57, No. 14, Jun. 2009, pp. 4046-4053.

Opinion accompanying the supplementary European search report for European Regional Phase Patent Application No. 12823315.2, filed pursuant to International Patent Application No. PCT/US2012/050936, dated Sep. 18, 2015.

A response to the Opinion accompanying the supplementary European search report for European Regional Phase Patent Application No. 12823315.2, filed pursuant to International Patent Application No. PCT/US2012/050936, dated Jan. 6, 2016, including clean and marked up the claims.

First Office Action for Chinese Patent Application No. 201280040063.9, filed pursuant to International Patent Application No. PCT/US2012/050936, dated May 6, 2015.

English translation of the First Office Action for Chinese Patent Application No. 201280040063.9, filed pursuant to International Patent Application No. PCT/US2012/050936, dated Sep. 7, 2015.

Response to the First Office Action for Chinese Patent Application No. 201280040063.9, filed pursuant to International Patent Application No. PCT/US2012/050936, dated Oct. 20, 2015.

Second Office Action for Chinese Patent Application No. 201280040063.9, filed pursuant to International Patent Application No. PCT/US2012/050936, dated Feb. 5, 2016.

English translation of the Second Office Action for Chinese Patent Application No. 201280040063.9, filed pursuant to International Patent Application No. PCT/US2012/050936, dated Feb. 26, 2016.

English translation of Pending Claims in the Second Office Action for Chinese Patent Application No. 201280040063.9, filed pursuant to International Patent Application No. PCT/US2012/050936, dated Feb. 26, 2016.

Jacobsen, et al., "Interconnected self-propagating photopolymer waveguides: an alternative to stereolithography for rapid formation of lattice-based open-cellular materials," Twenty First Annual International Solid Freeform Fabracation Symposium—An Additive Manufacturing Conference, 2010 pp. 846-853.

PCT Notification of Transmittal of the International Search Report and the Written Opinion of the International Searching Authority for PCT/US2012/050936, Feb. 18, 2013.

PCT Preliminary Report on Patentability and the Written Opinion of the International Searching Authority for PCT/US2012/050936, Feb. 17, 2014.

Office Action 1 for U.S. Appl. No. 13/584,108, dated Oct. 24, 2014.
Office Action 1 Response for U.S. Appl. No. 13/584,108, dated Dec. 18, 2014.

(56) References Cited

OTHER PUBLICATIONS

Office Action 2 for U.S. Appl. No. 13/584,108, dated Feb. 12, 2015.
Office Action 2 Response for U.S. Appl. No. 13/584,108, dated May 12, 2015.
Office Action 3 for U.S. Appl. No. 13/584,108, dated Jul. 16, 2015.
Office Action 3 Response for U.S. Appl. No. 13/584,108, dated Oct. 14, 2015.
Office Action 4 for U.S. Appl. No. 13/584,108, dated Nov. 12, 2015.
Office Action 4 Response for U.S. Appl. No. 13/584,108, dated Mar. 14, 2016.
Notice of Allowance for U.S. Appl. No. 13/584,108, dated Apr. 14, 2016.
Translation of Office Action 1 for Chinese Application No. 2014800144523, dated Jul. 29, 2016.
Translation of Search Report for Chinese Application No. 2014800144523, dated Jul. 29, 2016.
T.A. Schaedler, A.J. Jacobsen, A. Torrents, A.E. Sorensen, J. Lian, J.R. Greer, L. Valdevit, W.B. Carter, "Ultralight Metallic Microlattices," Science (2011), pp. 962-965.
A. Torrents, T. A. Schaedler, A. J. Jacobsen, W. B. Carter, L. Valdevit, "Characterization of nickel-based micro-lattice materials with structural hierarchy from the nanometer to the millimeter scale," Acta Materia Apr. 6, 2012.
Supplementary European search report for the European Regional Phase Patent Application No. 14783088.9, dated Jun. 14, 2016.
Evans, A.G., He, M.Y., Deshpande, V.S., Hutchinson, J.W., Jacobsen, A.J., Carter, W.B., 2010. Concepts for enhanced energy absorption using hollow micro-lattices. International Journal of Impact Engineering 37, No. 9, pp. 947-959.
Response to Office Action 1 for Chinese Application 2014800144523, dated Nov. 9, 2016.
Office Action 2 for Chinese Application No. 2014800144523, dated Mar. 1, 2017.
Response to Office Action 2 for Chinese Application No. 2014800144523, dated May 12, 2017.
Response to Second Office Action for Chinese Patent Application No. 201280040063.9, filed pursuant to International Patent Application No. PCT/US2012/050936, dated Apr. 8, 2016.
Third Office Action for Chinese Patent Application No. 201280040063.9, filed pursuant to International Patent Application No. PCT/US2012/050936, dated Aug. 10, 2016.
Response to Third Office Action for Chinese Patent Application No. 201280040063.9, filed pursuant to International Patent Application No. PCT/US2012/050936, dated Dec. 22, 2016.
Fourth Office Action for Chinese Patent Application No. 201280040063.9, filed pursuant to International Patent Application No. PCT/US2012/050936, dated Mar. 20, 2017.
Response to Fourth Office Action for Chinese Patent Application No. 201280040063.9, filed pursuant to International Patent Application No. PCT/US2012/050936, dated May 24, 2017.
Response for the European Regional Phase Patent Application No. 14783088.9, dated May 5, 2017.
Rejection Decision for Chinese Patent Application No. 201280040063.9, filed pursuant to International Patent Application No. PCT/US2012/050936, dated Aug. 10, 2017.
Text intended for Grant for European Regional Phase Patent Application No. 12823315.2, filed pursuant to International Patent Application No. PCT/US2012/050936, dated Nov. 25, 2016.
Communication under Rule 71(3) EPC for European Regional Phase Patent Application No. 12823315.2, filed pursuant to International Patent Application No. PCT/US2012/050936, dated Nov. 25, 2016.
Response to Rule 71(3) EPC for European Regional Phase Patent Application No. 12823315.2, filed pursuant to International Patent Application No. PCT/US2012/050936, dated Mar. 28, 2017.
Certification of Grant or European Regional Phase Patent Application No. 12823315.2, filed pursuant to International Patent Application No. PCT/US2012/050936, dated May 10, 2017.
Office Action 3 for Chinese Application No. 2014800144523, dated Jul. 26, 2017
Response to Office Action 3 for Chinese Application No. 2014800144523, dated Dec. 8, 2017.
PCT International Preliminary Report on Patentability for PCT/US2014/011715; dated Jul. 30, 2015.
PCT Notification Concerning Transmittal of International Preliminary Report on Patentability for PCT/US2014/011715; dated Jul. 30, 2015.

\* cited by examiner

400

Amplitude selective damping

Low amplitude sound wave does not transmit enough pressure to trigger buckling  Micro-lattice transmits sound wave High amplitude sound wave triggers buckling  Buckling absorbs acoustic energy and attenuates sound wave

MICROLATTICE DAMPING MATERIAL AND METHOD FOR REPEATABLE ENERGY ABSORPTION

CROSS-REFERENCE TO RELATED APPLICATIONS

This is a Continuation-in-Part application of U.S. Non-Provisional Utility application Ser. No. 13/584,108, filed on Aug. 13, 2012, entitled, "Ultra-light Micro-Lattices and a Method for Forming the Same", which is a Non-Provisional Utility Patent Application of U.S. Provisional Application No. 61/524,714, filed on Aug. 17, 2011, entitled, "Architected Ultra-light Micro-lattices: Redefining the Limits of Low-Density Materials."

This is ALSO a Non-Provisional Utility Patent Application of U.S. Provisional Application No. 61/753,848, filed on Jan. 17, 2013, entitled, "Micro-Lattice Damping Material and Method for Repeatable Energy Absorption."

GOVERNMENT RIGHTS

This invention was made with government support under U.S. Government Contract. Number W91CRB-10-0305 from US Army Readiness Command. The government has certain rights in the invention.

BACKGROUND OF THE INVENTION

(1) Field of Invention

The present invention relates to a micro-lattice and, more particularly, to a micro-lattice damping material and a method for repeatable energy absorption.

(2) Description of Related Art

The present invention is directed to a material that can be used for damping, such as acoustic damping and vibration damping. Acoustic damping or quieting is a process by which components, such as machinery, is made quieter through acoustic absorption to minimize the acoustic impacts of such components. Acoustic absorption is traditionally accomplished using porous materials, such as open-cell foams, fibrous materials, carpets and draperies. Such porous materials absorb acoustic energy by oscillation of the air molecules in the interconnected pores (air friction). This mechanism is fundamentally different from the buckling mechanism used in the present invention and causes the damping to be a strong function of frequency (small absorption at low frequencies) and material thickness. Furthermore, closing the pores (e.g., by painting) reduces the effectiveness of such traditional acoustic absorption materials.

Alternatively, vibration damping is often accomplished using viscoelastic polymers. These materials absorb energy by polymer chains sliding under stress, which is responsible for the viscous flow. The efficacy of viscoelastic polymers is strongly dependent on temperature and, therefore, viscoelastic polymers exhibit high damping coefficient only in a small temperature range (see figure below). The consequence of this is either poor performance at temperature extremes or the use of blends of polymers which provides less performance across a broader temperature window.

Thus, a continuing need exists for a damping material that provides for a high damping coefficient with an ability to repeatedly absorb a large amount of energy.

SUMMARY OF INVENTION

The present invention relates to a micro-lattice and, more particularly, to a micro-lattice damping material and a method for repeatable energy absorption. The present invention is operable to provide high damping, specifically acoustic, vibration or shock damping, by utilizing the energy absorption mechanism of hollow tube buckling (as provided for by the micro-lattice).

The clamping material is a micro-lattice formed of a three-dimensional interconnected network of hollow tubes.

In one aspect, the hollow tubes are formed of a material and have a wall thickness and a diameter, such that a wall thickness to diameter ratio is less than $3\varepsilon_y$, where $\varepsilon_y$ denotes a yield strain material property of the material forming the hollow tubes.

In yet another aspect, the hollow tube diameter is between 10 μm and 10 cm.

In another aspect, the hollow tubes are formed of a material selected from a group consisting of metal, ceramic, and a polymer.

In yet another aspect, a constraining layer is attached with the micro-lattice, with the micro-lattice being connectable with an object to be dampened.

In another aspect, the micro-lattice includes a damping coefficient (tan δ) that is greater than 0.05.

In yet another aspect, the micro-lattice has a density smaller than 0.1 g/cm$^3$.

In another aspect, the micro-lattice is partially compressed between two materials such that the micro-lattice is pre-loaded with strain. As a non-limiting example, the micro-lattice is preloaded to strains between 3% and 50%.

In another aspect, the micro-lattice has a density of 10 mg/cm$^3$ or less.

In yet another aspect, the micro-lattice is adapted to provide for damping at temperatures greater than 300 degrees Celsius, temperatures lower than negative 100 degrees Celsius, or over a temperature range exceeding 200 degrees Celsius.

In another aspect, the micro-lattice is attached to one or more face sheets.

In yet another aspect, the invention is directed to a method for damping through repeatable energy absorption, comprising acts of receiving a load in a micro-lattice having a network of interconnected hollow tubes (the load causing elastic buckling of the hollow tubes and/or nodes where the tube intersect); and removing the load, resulting in the micro-lattice decompressing, whereby upon removing the load, the micro-lattice recovers its original shape.

In another aspect, the invention is directed to a constrained layer damper, comprising a micro-lattice formed of a three-dimensional interconnected network of hollow tubes, the micro-lattice attached with an object to be dampened; and a constraining layer attached with the micro-lattice such that the micro-lattice is sandwiched between the object to be dampened and the constraining layer.

In another aspect, the invention is directed to an amplitude selective damping material, comprising a micro-lattice that requires a threshold stress to trigger buckling and concomitant energy absorption.

In another aspect, the invention is directed to an anisotropic damping material, comprising a micro-lattice formed to provide anisotropic damping properties.

In yet another aspect, the damping material includes a micro-lattice formed of a three-dimensional interconnected network of hollow tubes and two layers of material, with the micro-lattice being partially compressed between the two layers such that the micro-lattice is pre-loaded with strain.

Finally, the present invention also includes methods for forming and using the damping materials described herein.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1A:
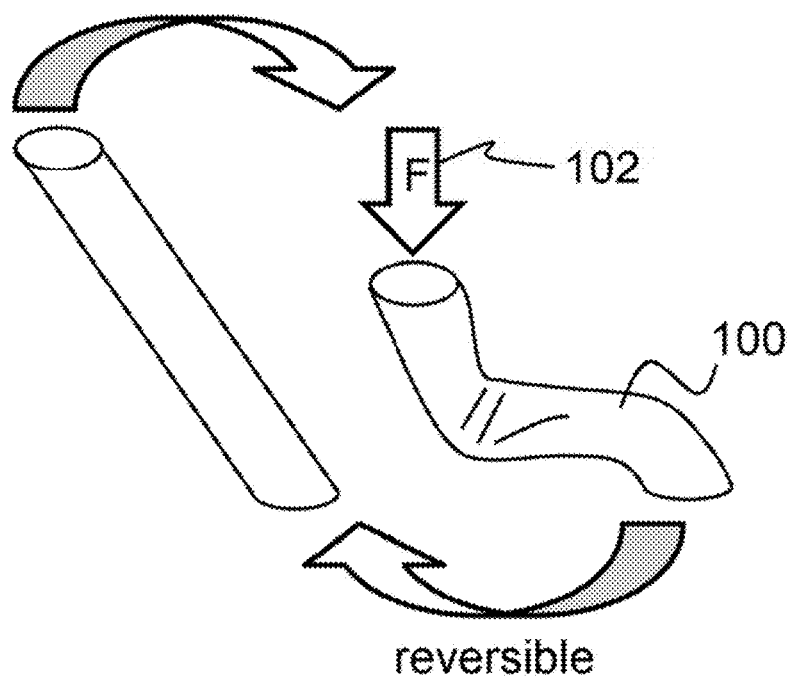
FIG. 1A is a schematic illustration of a damping mechanism according to the principles of the present invention, depicting hollow tube buckling that is reversible and absorbs energy.

The present invention relates to a micro-lattice and, more particularly, to a micro-lattice damping material and a method for repeatable energy absorption. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is only one example of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6, In particular, the use of "step of" or "act of" in the claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Before describing the invention in detail, first an introduction provides the reader with a general understanding of the present invention. Next, specific details of the present invention are provided to give an understanding of the specific aspects.

(1) INTRODUCTION

The present invention relates to a micro-lattice and, more particularly, to a micro-lattice damping material and a method for repeatable energy absorption (through reversible deformation). An example of a suitable micro-lattice that can be used as a damping material in accordance with the present invention was described in U.S. Non-Provisional Utility application Ser. No. 13/584,108, filed on Aug. 13, 2012, entitled, "Ultra-light Micro Lattices and a Method for Forming the Same", which is incorporated herein by reference as though fully set forth herein. Using such a micro-lattice structure, the present invention is operable to provide high damping, specifically acoustic, vibration or shock damping, by utilizing the energy absorption mechanism of hollow tube buckling (as provided for by the micro-lattice).

Described below is the structure of example micro-lattice damping materials and the method by which these materials absorb energy on cyclic loading. Briefly, the invention entails a three-dimensional lattice structure of interconnected hollow tubes that has a high damping or loss coefficient. A unique aspect is the energy absorption by elastic buckling of the hollow tubes and/or nodes where the tubes intersect, which is fundamentally different from conventional damping mechanisms and can be used for acoustic, vibration and shock damping. Importantly, the micro-lattice allows for dampening efficacy at a fraction of the weight of other materials. For example, acoustic measurements have demonstrated acoustic absorption performance of micro-lattices similar to foam, but with one-fifth of the weight of foam. Thus, in one aspect, this invention enables the design of metallic or ceramic micro-lattice materials with damping properties similar to viscoelastic polymers while retaining the advantages of metals or ceramics, for example temperature insensitivity (compared with only 20-30 Celsius range for viscoelastic materials), environmental stability, high specific stiffness and strength.

The material can be utilized as an acoustic absorber that is dramatically thinner and lighter than traditional acoustic absorbers. Additionally, it can be utilized in, for example, automobiles as a vibration dampener to dampen sound and provide for impact protection. In another aspect, it can be used as a constrained layer damper to dampen vibrations of panels in a plane or rotorcraft fuselage, particularly with lower weight, less temperature dependence and multifunctional properties (e.g., simultaneous vibration damping and heating/cooling). In yet another aspect, it can be used as a high temperature damper that enables acoustic and vibration damping close to combustion and turbine engines, which are often the source. In space applications, it can be used as a deployable vibration or shock damper, utilizing the recoverable deformation ability of the lattice. In another aspect, the micro-lattice can be employed as a cushion for fragile payloads during spacecraft launch or, in yet another aspect, it can be used as an acoustic absorber for underwater applications, such as on ships and submarines. Thus, as can be appreciated, the unique properties of the micro-lattice allow it to be utilized in a variety of damping applications.

(2) SPECIFIC DETAILS

Figure 1B:
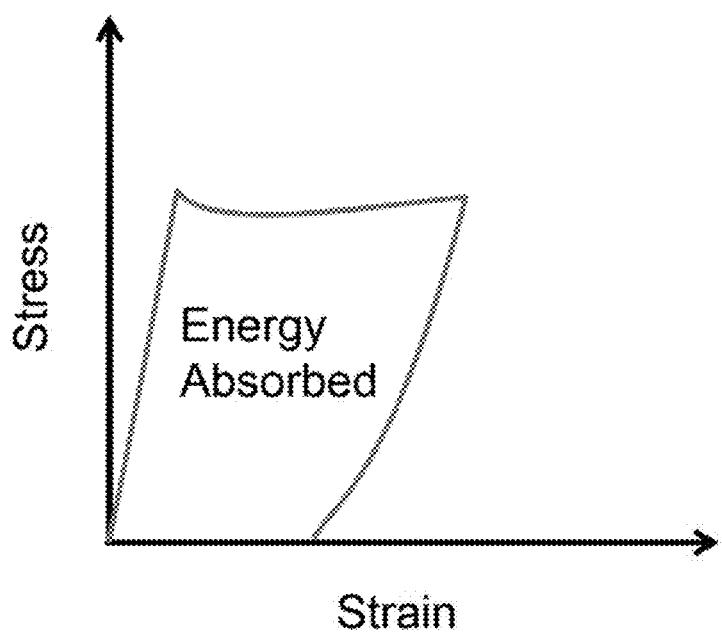
FIG. 1B is a chart showing the stress and strain during compression and release of a microlattice material consisting of an array of hollow tubes, illustrating energy absorption of the hollow tubes as they buckle.

As noted above, the present invention is directed to a micro-lattice damping material and the associated damping mechanism. The damping mechanism is based on energy absorption by elastic buckling of hollow tubes as illustrated in FIGS. 1A and 1B. Specifically, FIG. 1A depicts a hollow tube 100 of a damping mechanism, illustrating a force 102 being applied to the hollow tube 100 and demonstrating hollow tube buckling, that is reversible and absorbs energy. For further understanding, FIG. 1B is a chart illustrating energy absorption of the hollow tube 100 as it buckles.

Figures 2A, 2B:
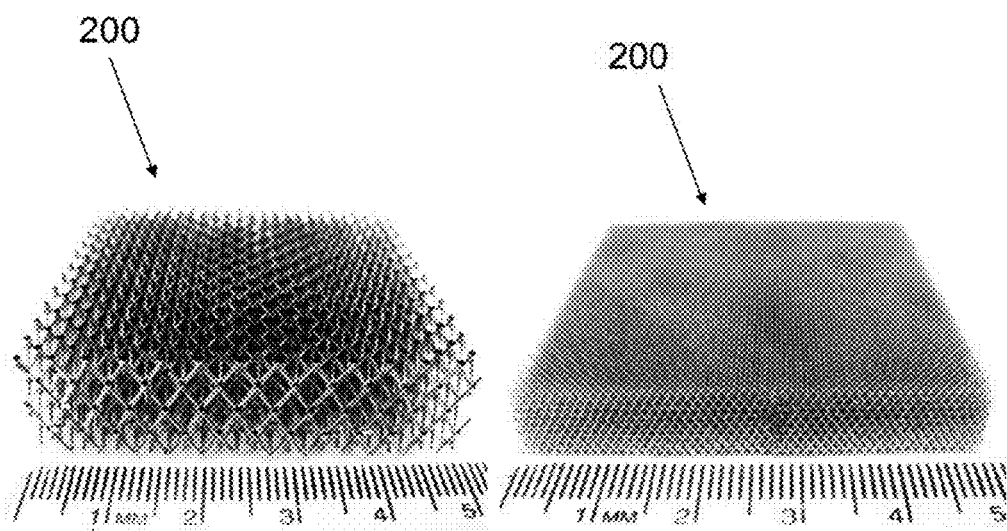
FIG. 2A is an illustration of a micro-lattice damping material.
FIG. 2B is an illustration of a micro-lattice damping material.

Although FIG. 1A illustrates a single hollow tube 100, as shown in FIGS. 2A and 2B, it is to be understood that the invention includes a three-dimensional lattice structure of interconnected hollow tubes that form the micro-lattice damping material 200. Specifically, FIGS. 2A and 2B illustrate two examples of the micro-lattice damping material 200. The micro-lattice damping material illustrated in FIGS. 2A and 2B can be formed using any suitable technique, a non-limiting example of which was described in U.S. application Ser. No. 13/584,108. As noted above, this micro-lattice 200 has a high damping or loss coefficient and can be used for acoustic, vibration and shock damping.

The damping material can be formed of metallic or ceramic micro-lattice materials (or any other suitable material) with damping properties similar to viscoelastic polymers while retaining the advantages of metals or ceramics, such as temperature insensitivity, environmental stability, high specific stiffness and strength. For example, a metallic Ni-7% P micro-lattice damping material has been demonstrated with a loss coefficient tan $\delta$=0.2, which is ten times higher than conventional nickel foams. Such a material was formed by electroless nickel plating a thin coating of Ni-7% P onto polymer micro-lattice templates (as described in U.S. application Ser. No. 13/584,108 and depicted in FIG. 3).

Figure 3:
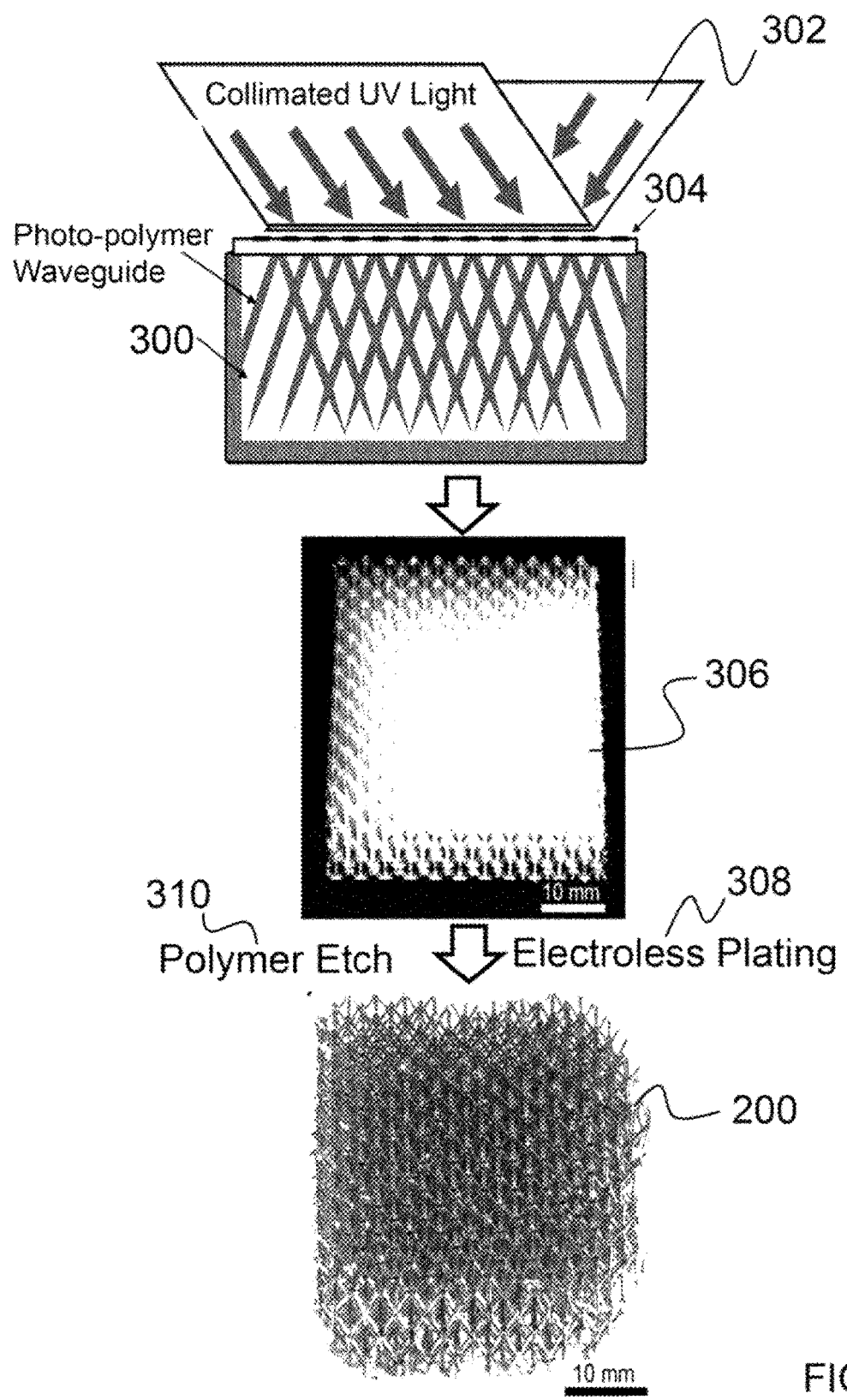
FIG. 3 is an illustration depicting a method for forming a micro-lattice material.

As shown in FIG. 3, an example of a micro-lattice damping material 200 was fabricated using a self-propagating photopolymer waveguide technique, whereby a suitable liquid photomonomer 300 is exposed to collimated UV light 302 through a patterned mask 304, producing an interconnected three-dimensional photopolymer lattice 306. A non-limiting example of a suitable liquid photomonomer 300 is a thiol-ene resin.

With this method, a wide array of different architectures with unit cells in the 0.1 to >10 mm range can be made by altering the mask 304 pattern and the angle of the incident light. As a non-limiting example, architectures can be generated with 1-4 mm lattice member length L, 100-500 µm lattice member diameter 100-500 nm wall thickness t, and 60° inclination angle $\theta$, similar to the micro-lattices depicted in FIGS. 2A and 2B.

It should be noted that the polymer lattice 306 is an open cellular template. After the polymer lattice 306 is generated, films (e.g., conformal nickel-phosphorous thin films) were deposited on the polymer lattices 306.

In coating (i.e., depositing) the lattice 306 (i.e., template) with a film of material, the template is coated using any suitable deposition technique, non-limiting examples of which include electroless-plating 308, electrophoretic deposition, chemical vapor deposition, physical vapor deposition, atomic layer deposition, solution deposition or sol-gel deposition. For Nickel coatings, electroless plating works well, while electrophoretic deposition works well for multicomponent alloys e.g. steel. Chemical vapor deposition and physical vapor deposition work well for diamond and titanium nitride, respectively, while atomic layer deposition, works well for silica. The deposition techniques described above can also be employed with ceramic materials as desired.

Thereafter, the polymer is subsequently etched out 310 (via chemical etching or any other suitable etching technique that is gentle enough not to destroy the micro-lattice). The etchant has to be selective with respect to the template and the coating material, i.e., the etching rate of the template needs to be substantially faster than that of the coating. For nickel coatings on thiol-ene templates, sodium hydroxide solution is a desired etchant. For other material combinations, organic solvents, plasma etching, thermal pyrolysis or other etchants are favored. Freeze drying is used for fragile micro-lattices that are deformed by capillary forces on removal from solution.

In one example, the auto-catalytic electroless nickel plating reaction enables deposition of thin films with controlled thickness on complex shapes and inside pores without noticeable mass transport limitations. By controlling reaction time, a wall thickness of 100 nm can be achieved while maintaining a uniform conformal coating. The resulting micro-lattice material 200 essentially translates the deposited nano-scale thin film in three dimensions to form a macroscopic material where the base structural elements are hollow tubes (as shown in FIG. 1). It should be noted that any suitable material can be deposited on the polymer lattice 306, non-limiting examples of which include nickel, zinc, chrome, tin, copper, gold silver, platinum, rhodium, aluminum, a ceramic, including, diamond, diamond like carbon, alumina, zirconia, tin oxide, zinc oxide, silicon carbide, silicon nitride, titanium nitride, tantalum nitride, tungsten nitride, a polymer including parylene or combinations or alloys thereof, including multi-layers of different materials.

In one non-limiting example, transmission electron microscopy (TEM) revealed that the as-deposited electroless nickel thin films are nano-crystalline, with ~7 nm grain sizes. Energy-dispersive X-ray spectroscopy confirmed that the composition of the deposit is 7% phosphorous and 93% nickel by weight. Since the films were not annealed after deposition, they remained as a supersaturated solid solution of phosphorous in crystalline face-centered cubic (fcc) nickel lattice with no $Ni_3P$ precipitates present. The 7 nm grain size, renders electroless nickel thin films harder and more brittle than typical nano- and micro-crystalline nickel. A hardness of 6 GPa and modulus of 210 GPa were measured by nano-indentation and hollow tube compressions.

Micro-lattices with these extreme low densities exhibit unique mechanical behavior. Compression experiments on micro-lattices show recovery from strains exceeding 50%.

Figure 4A:
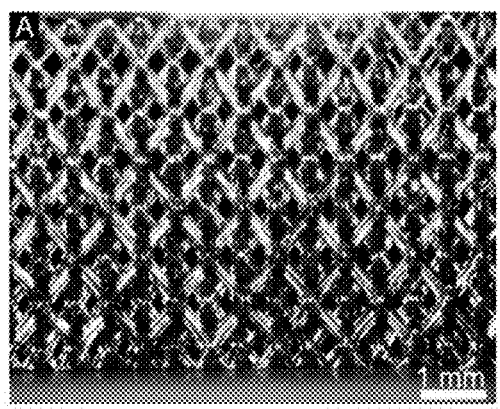
FIG. 4A is an illustration of a micro-lattice sample pi of to compression.
Figure 4B:
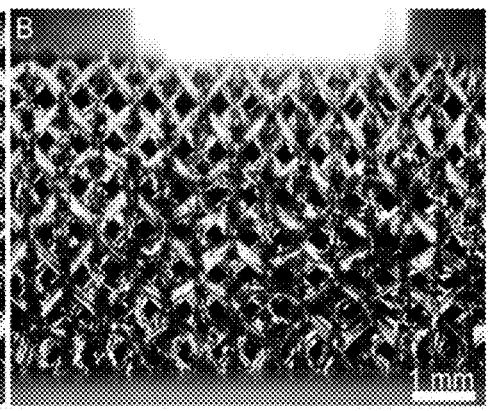
FIG. 4B is an illustration of the micro-lattice sample, depicting the sample at ~10% compression.
Figure 4C:
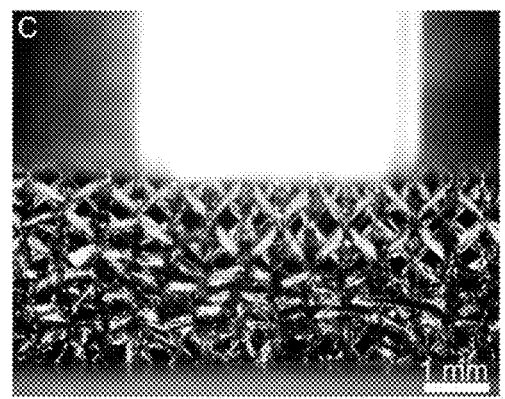
FIG. 4C is an illustration of the micro-lattice sample, depicting the sample at 50% compression.
Figure 4D:
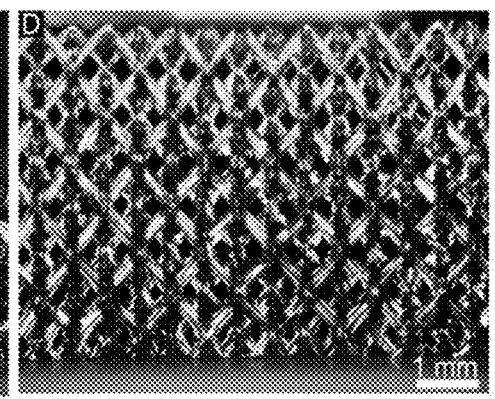
FIG. 4D is an illustration depicting the micro-lattice sample after the compression load is removed, illustrating that the micro-lattice recovers approximately 98.6% of its original height and resumes its original shape.
Figure 4E:
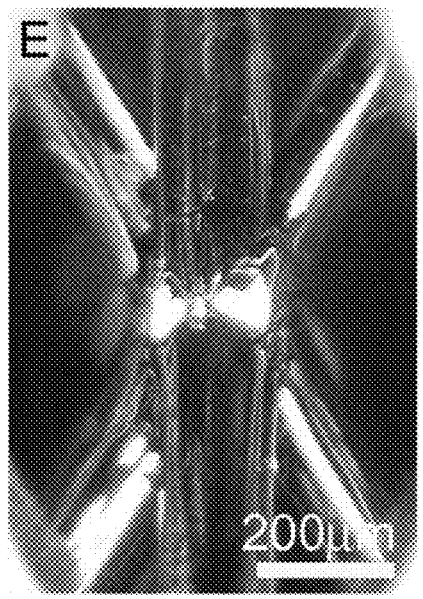
FIG. 4E is an optical image of a unit cell of the micro-lattice, in an unloaded or uncompressed condition.
Figure 4F:
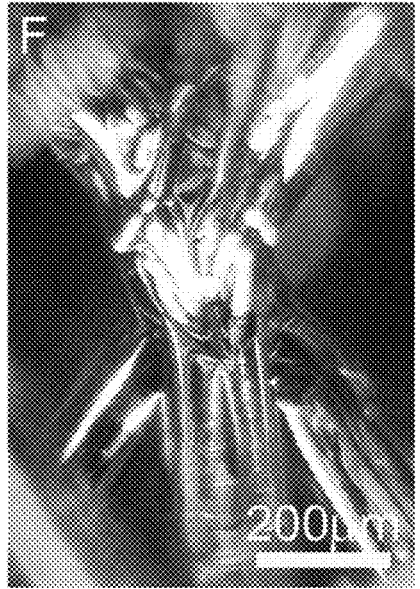
FIG. 4F is an optical image of the unit cell, depicting the unit cell as accommodating compressive strain by buckling at its node.
Figure 4G:
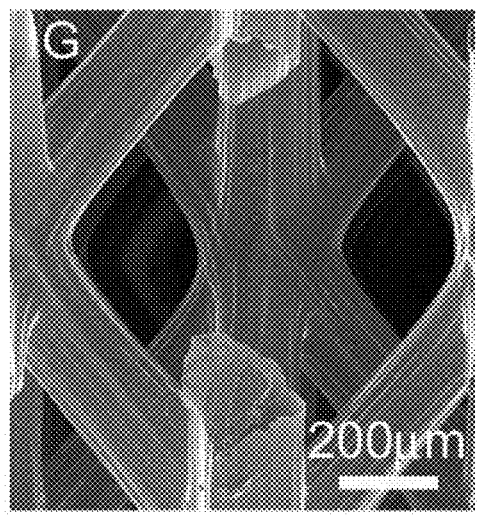
FIG. 4G is a scanning electron microscopy (SEM) image of a node before compression testing.
Figure 4H:
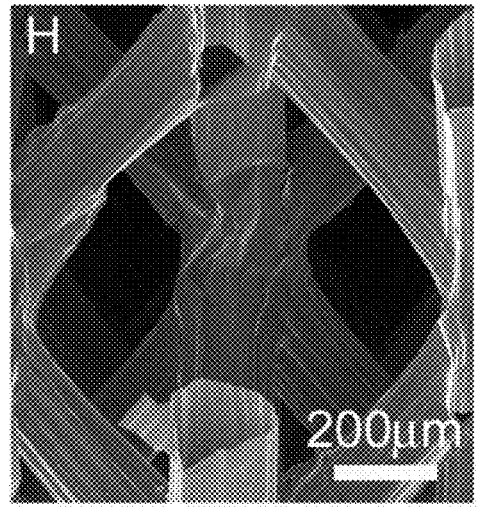
FIG. 4H is an SEM image of the node after six compression cycles at 50% strain.
Figure 5A:
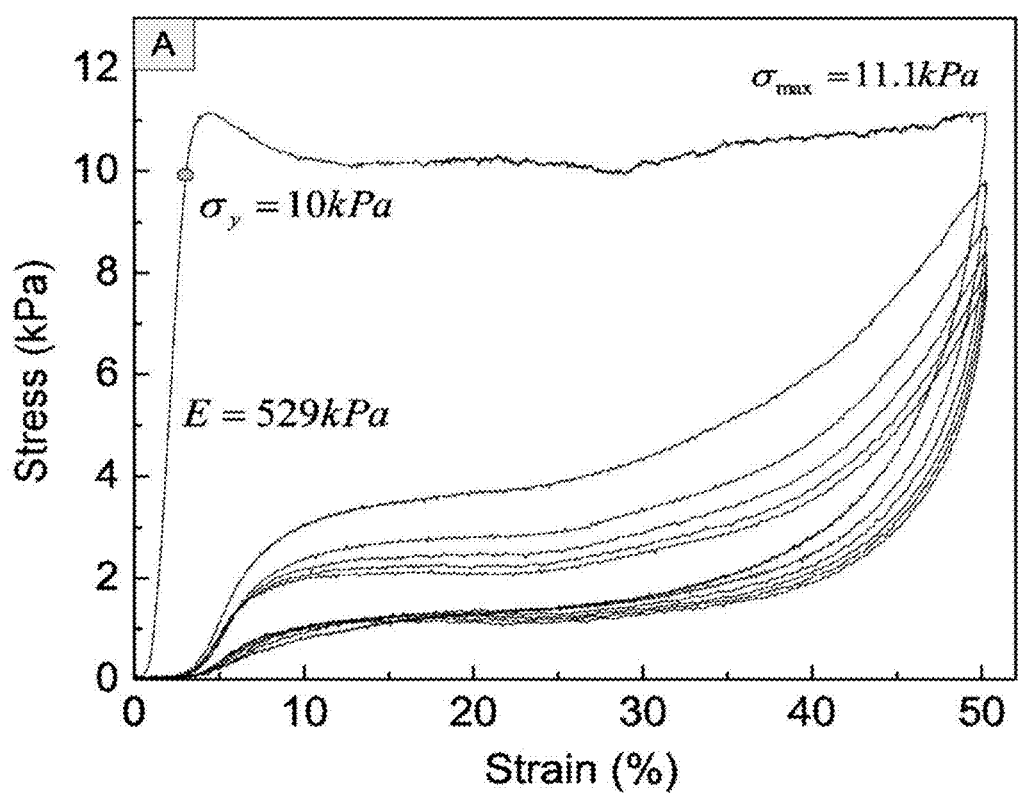
FIG. 5A is a graph illustrating a stress-strain curve measured in compression of a microlattice at a prescribed displacement rate of 10 μm/sec.

FIGS. 4A through 4D provide images of a micro-lattice sample 400 with 14 mg/cc (L: 1050 μm, D: 150 μm, t: 500 nm) during compression testing while FIG. 5A conveys the corresponding stress-strain curve measured at a prescribed displacement rate of 10 μm/sec. In these experiments, the sample was not attached to face sheets or the compression platens at the bottom or the top. FIG. 4A depicts the micro-lattice sample 400 prior to compression. As shown in FIG. 4B, upon first compression, the lattice exhibits a compressive modulus of 529 kPa, with deviations from linear elastic behavior starting at a stress of 10 kPa. The stress decreases slightly after the peak associated with buckling and node fracture events, and a broad plateau is subsequently formed in the stress-strain curve as buckling and localized node fracture events spread through the lattice. FIG. 4C shows the micro-lattice at 50% compression. Upon unloading, the stress drops rapidly but does not approach zero until the platen is close to its original position. After removing the load, the micro-lattice recovers to 98.6% of its original height and resumes its original shape (as shown in FIG. 4D). For further illustration, FIGS. 4E through 4H provide images of the micro-lattice sample through its compression and recovery. More specifically, FIG. 4E is an optical image of a unit cell of the micro-lattice, in an unloaded or uncompressed condition. FIG. 4F is an optical image of the unit cell, depicting how the unit cell accommodates compressive strain by buckling at the nodes. FIG. 4G is a scanning electron microscopy (SEM) image of a node before testing, while FIG. 4H is an SEM image of the node after six compression cycles at 50% strain.

Interestingly, the stress-strain behavior corresponding to the $1^{st}$ cycle is never repeated during subsequent testing. Rather, during a second compression, the peak stress is absent and the 'pseudo-hardening' behavior changes, but the stress level achieved at 50% strain is only 10% lower than that after the first cycle. Consecutive compression cycles exhibit stress-strain curves nearly identical to the second compression.

Figure 5B:
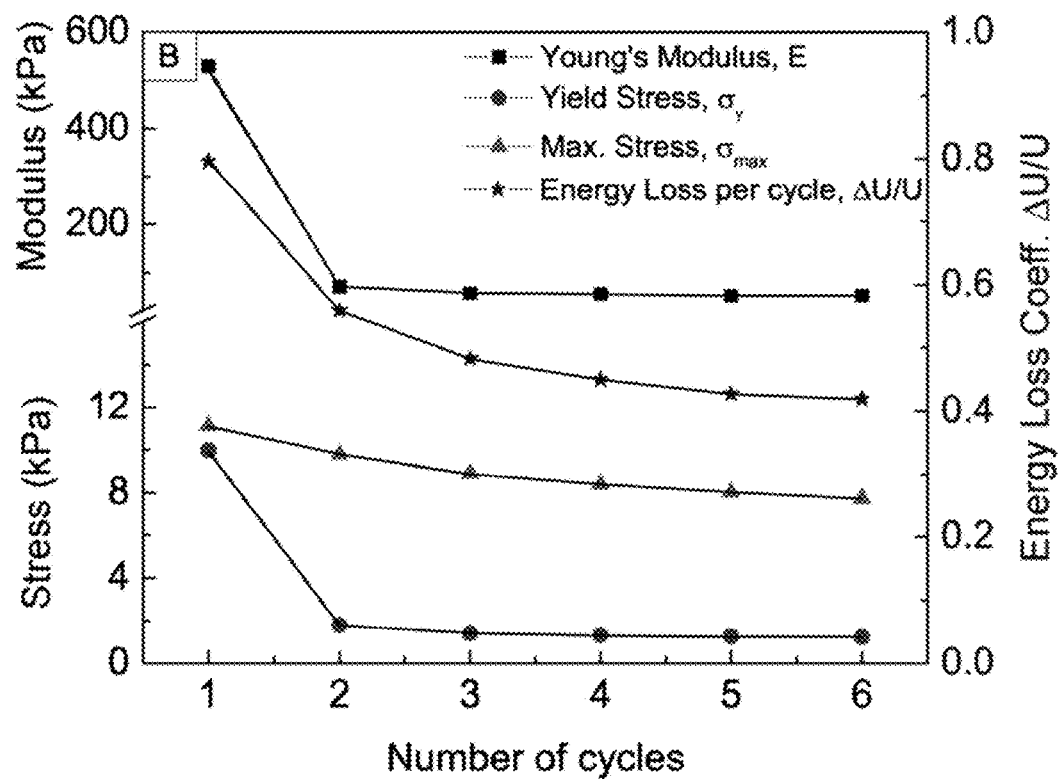
FIG. 5B is a graph of illustrating how stiffness and strength initially diminish with cycle number and then stabilize.

As shown in FIG. 5B, stiffness and strength diminish with cycle number, but are almost constant after the third cycle (as shown in FIG. 5B). The micro-lattice shows significant hysteresis during compression experiments, allowing a measurement of the energy absorption, which is estimated to be 2.2 mJ for the first cycle. After three cycles a nearly constant energy loss coefficient of ~0.4 is calculated by dividing the absorbed energy by the total energy required for compression (as shown in FIG. 5B).

Figure 5C:
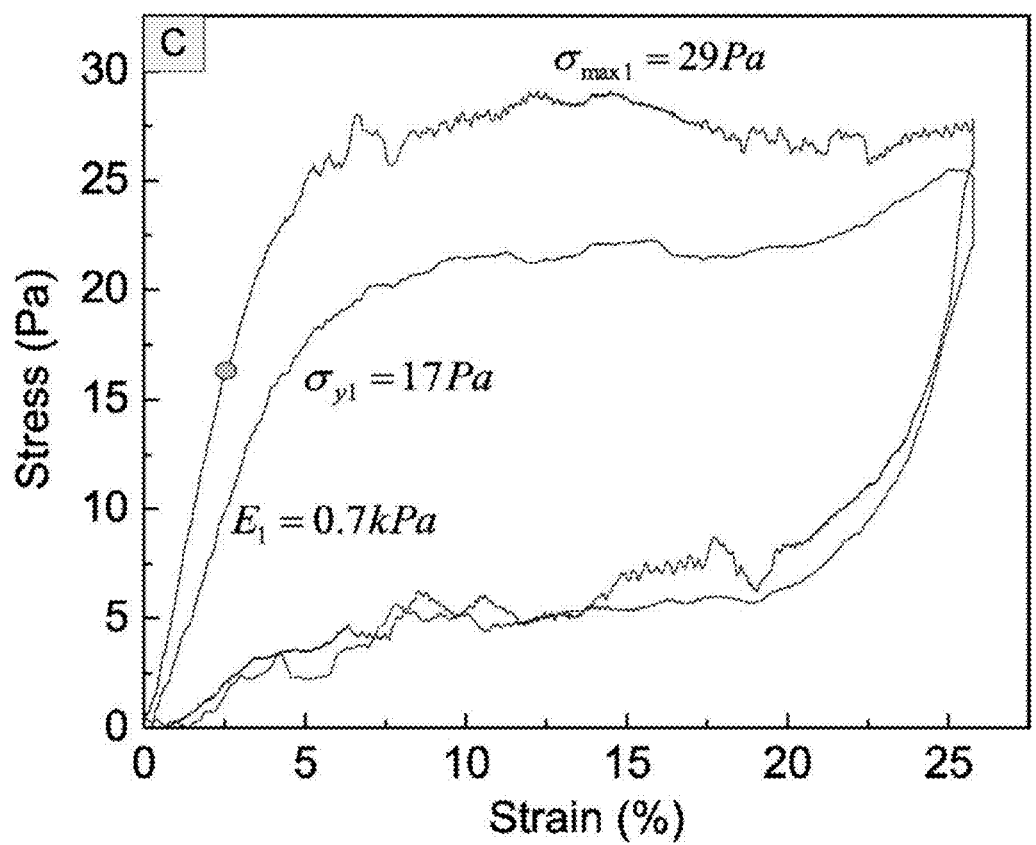
FIG. 5C is a graph illustrating stress-strain curves of the first two compression cycles of a sample with a density of 1 mg/cc and larger unit cells (L: 4 mm, D: 500 μm, t: 120 nm)
Figure 5D:
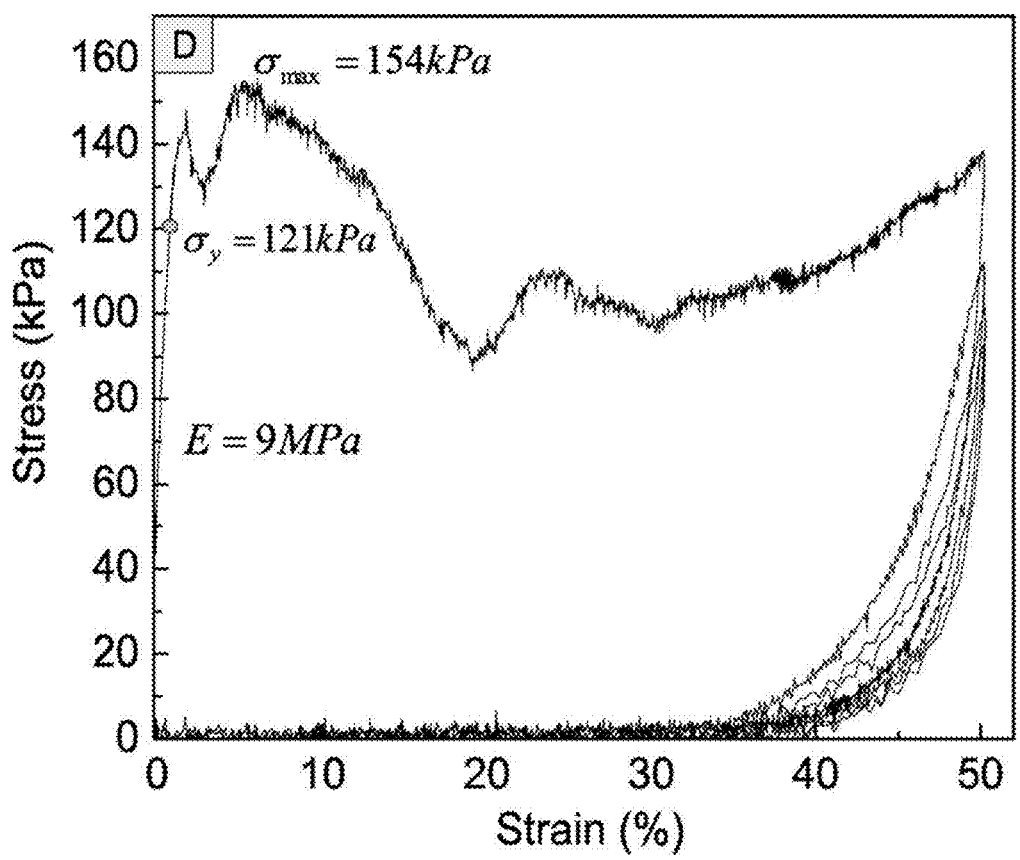
FIG. 5D is a graph illustrating stress-strain curves of the compression of a sample with 43 mg/cc (L: 1050 μm, D: 150 μm, t: 1400 nm)

FIG. 5C shows the stress-strain curves of the first two compression cycles of a sample with a density of 1 mg/cc and larger unit cells (L: 4 mm, D: 500 μm, t: 120 nm) illustrating similar behavior of different micro-lattices in the ultra-low density regime. Increasing the density and wall thickness will eventually lead to compression behavior more typical for metallic cellular materials. FIG. 5D shows the compression of a sample with 43 mg/cc (L: 1050 μm, D: 150 μm, t: 1400 nm): notice that strain recovery upon unloading from 50% strain is essentially absent.

Optical examination of the ultra-light micro-lattices during deformation suggests that deformation initiates by Brazier buckling at the nodes (as shown in FIGS. 4E and 4F). A closer inspection of the micro-lattices by SEM shows that cracks and wrinkles are introduced primarily at the nodes during 50% compression (as shown in FIGS. 4G and 4H). This damage is responsible for the 1-2% residual strain observed after the first compression cycle, and the drop in the yield strength and modulus during subsequent compression cycles. Once stable relief cracks form at the nodes, the bulk micro-lattice material can undergo large compressive strains without enduring further fracture or plastic deformation in the solid nickel-phosphorous material, thus exhibiting the reversible compressive behavior shown in FIGS. 4A through 5D. It is clear that the extremely small aspect ratio of the hollow tube wall thickness to tube diameter plays a key role in the nearly full deformation recoverability, by allowing truss members to undergo large rotations about remnant nodal ligaments without accumulation of significant plasticity. Increasing this aspect ratio leads to excessive fracture and loss of the recoverable deformation behavior (as shown in FIG. 5D). The quasi-static compression testing shows recoverable deformation from strains exceeding 50% and large energy absorption embodied by the hysteresis in the stress-strain curves.

Figure 5E:
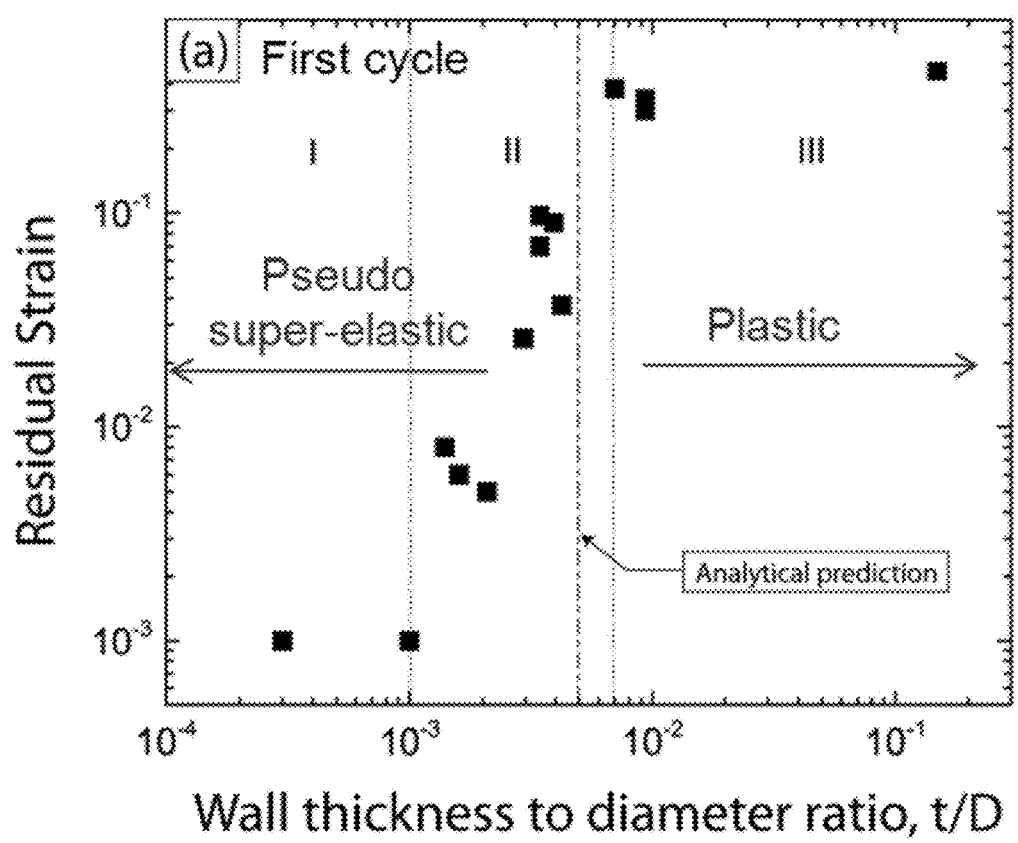
FIG. 5E is a graph illustrating an effect of the aspect ratio t/D of wall thickness (t) over diameter (D) on Ni-7% P micro-lattice compression behavior.

The effect of the aspect ratio t/D (hollow tube wall thickness/diameter) is further illustrated in FIG. 5E, which leads to the innovation that an aspect ratio t/D on the order of or smaller than the yield strain of the material is desired to enable the pseudo super-elastic behavior that is linked to elastic buckling of the hollow tubes. As a non-limiting example, the hollow tubes have a wall thickness and a diameter, such that a wall thickness to diameter ratio is less than 3 $\varepsilon_y$ (i.e., 3 multiplied by $\varepsilon_y$) where $\varepsilon_y$ denotes the yield strain material property of the material forming the hollow tubes. For Ni-7% P micro-lattices, for example, t/D must be on the order of or smaller than 0.01 for reversible deformation (buckling) and high damping, and the yield strain of the Ni-7% P has been determined to be 0.012 by measuring the yield strength as 2500 MPa and the Young's modulus as 210 GPa. For a different material, for example copper, the yield strain is different. In the case of copper it is 0.0034 and, therefore, the hollow tube aspect ratio t/D must be on the order of or smaller than 0.0034 to enable reversible deformation and high damping. The mechanics of the reversible buckling and how different materials perform was described in further detail by Kevin J. Maloney, Christopher S. Roper, Alan J. Jacobsen, William B. Caner, Lorenzo Valdevit et al., in "Microlattices as architected thin films: Analysis of mechanical properties and high strain elastic recovery," APL Mater, 1, 022106 (2013); doi: 10.1063/1.4818168, which is incorporated by reference as though fully set forth herein.

Although similar stress-strain curves as presented in FIG. 5A are typical for foams of viscoelastic polymer and carbon nanotube forests, they are unprecedented for metal-based materials. This mechanical behavior is especially surprising considering the relatively brittle nature of the constituent material.

However, the micro-lattices exhibit completely different bulk properties: the cellular architecture effectively transforms the brittle thin-film property into a ductile and super-elastic lattice behavior by enabling sufficient freedom for deformation and tolerance to local strains, such as forming relief cracks that are stable during repeated compression cycles, while still maintaining the structure to remain coherent. Hence, cellular material architecture can fundamentally change the material properties and generate functional ductility and functional superelasticity at the bulk scale.

Figure 6:
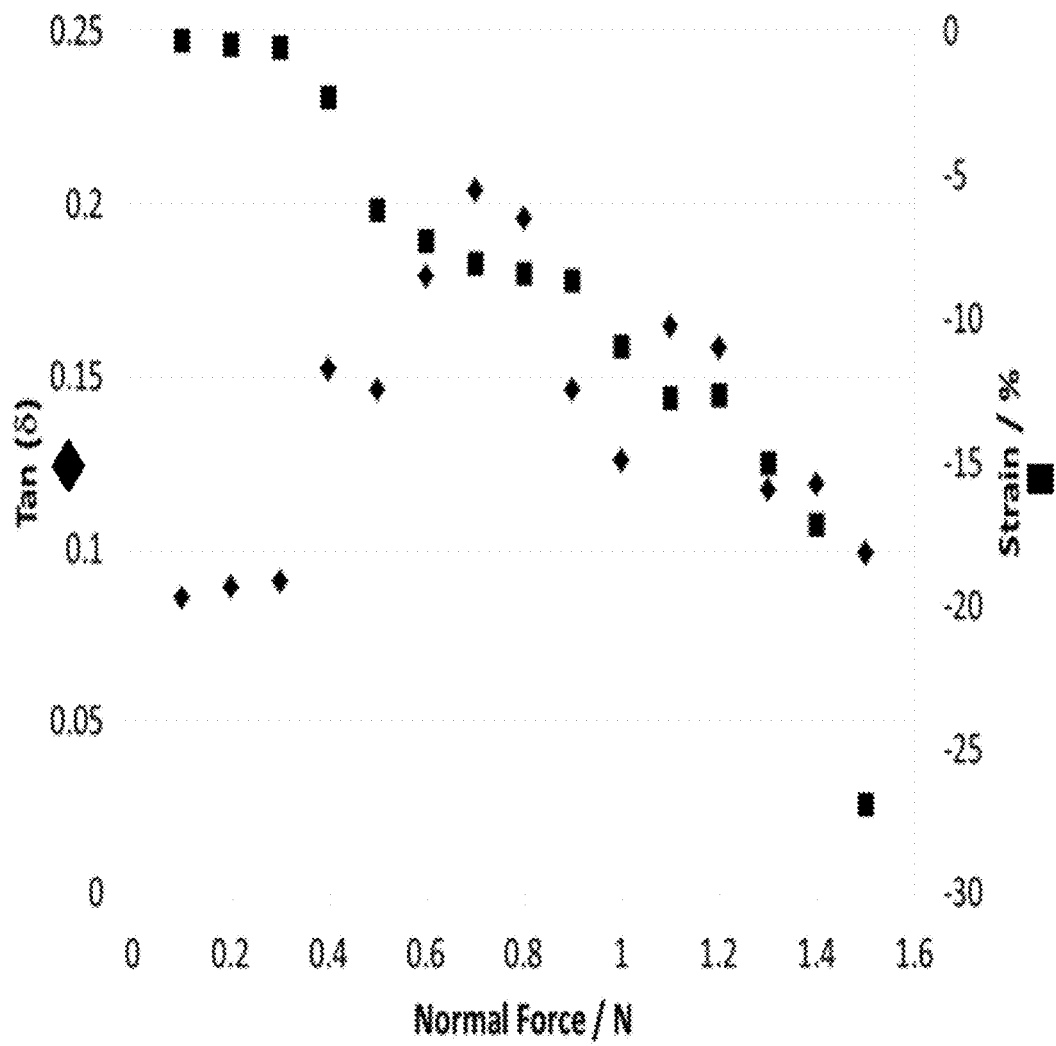
FIG. 6 is a graph illustrating the damping coefficient (tan δ) and strain vs. normal force (preload) of a "virgin" Ni-7% P micro-lattice with a density=14 mg/cm$^3$ in a compression DMA test at frequency=1 Hz and amplitude=5 μm.
Figure 7:
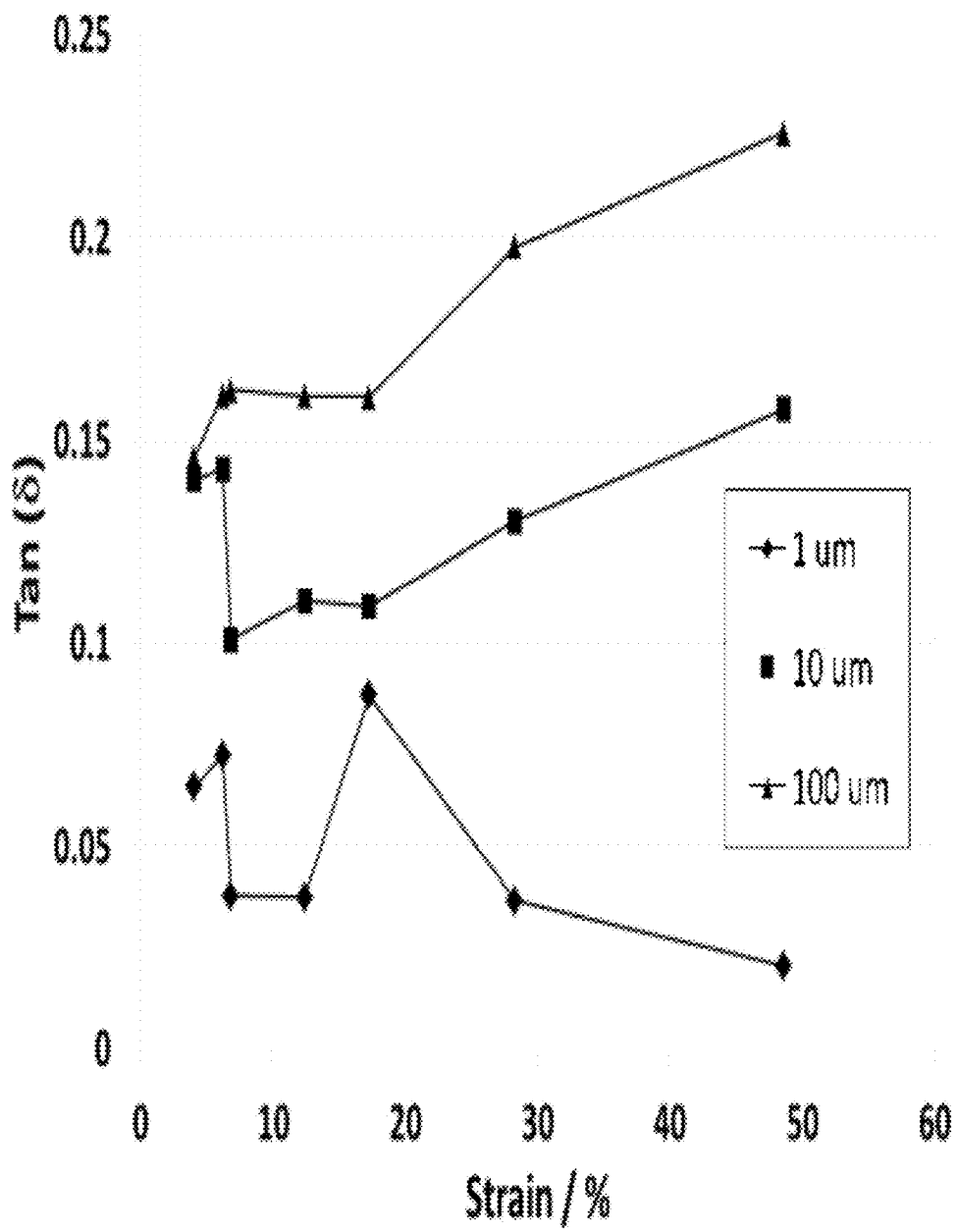
FIG. 7 is a graph illustrating the damping coefficient vs. strain of a pre-compressed Ni-7% P micro-lattice with a density=12 mg/cm$^3$ in a compression DMA test at frequent=1 Hz and three different amplitudes.
Figure 8:
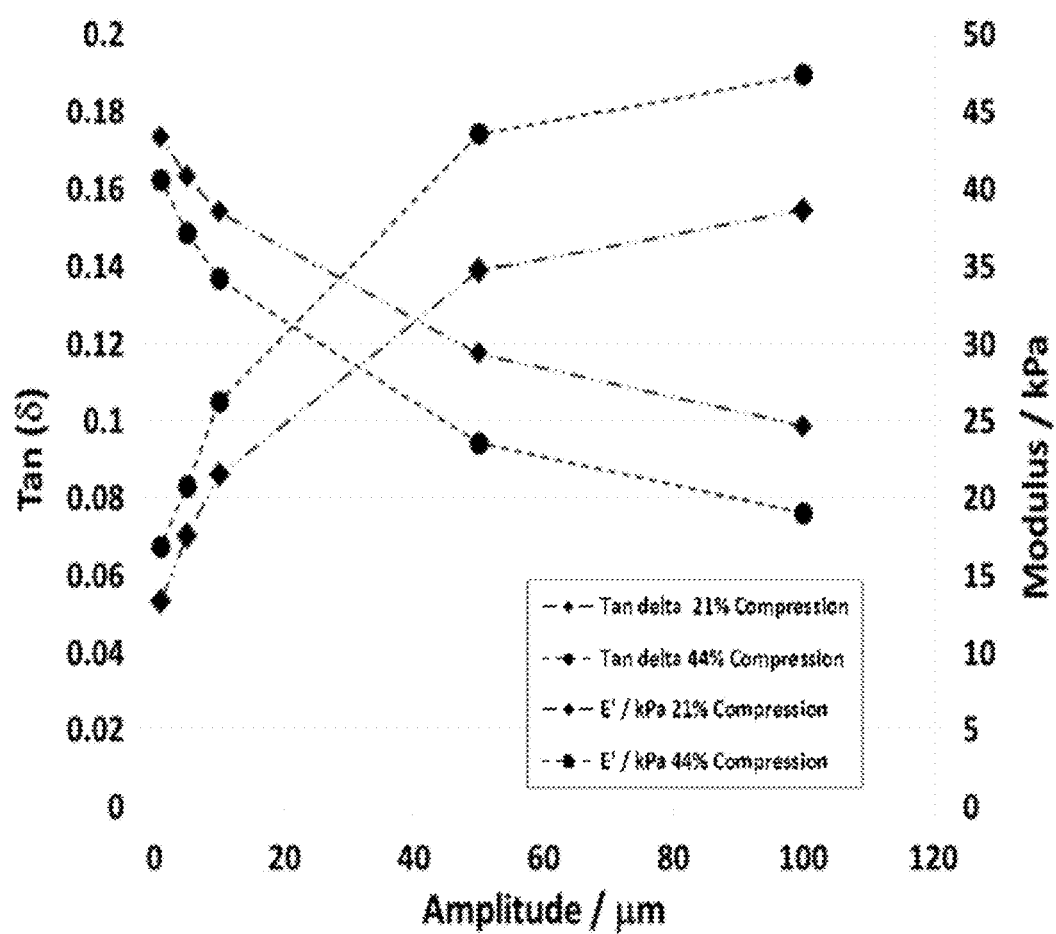
FIG. 8 is a graph illustrating the damping coefficient and shear modulus vs. amplitude of a Ni-7% P micro-lattice with a density ~20 mg/cm$^3$ in a shear DMA test at frequency=1 Hz and two different pre-compression strains.
Figure 9:
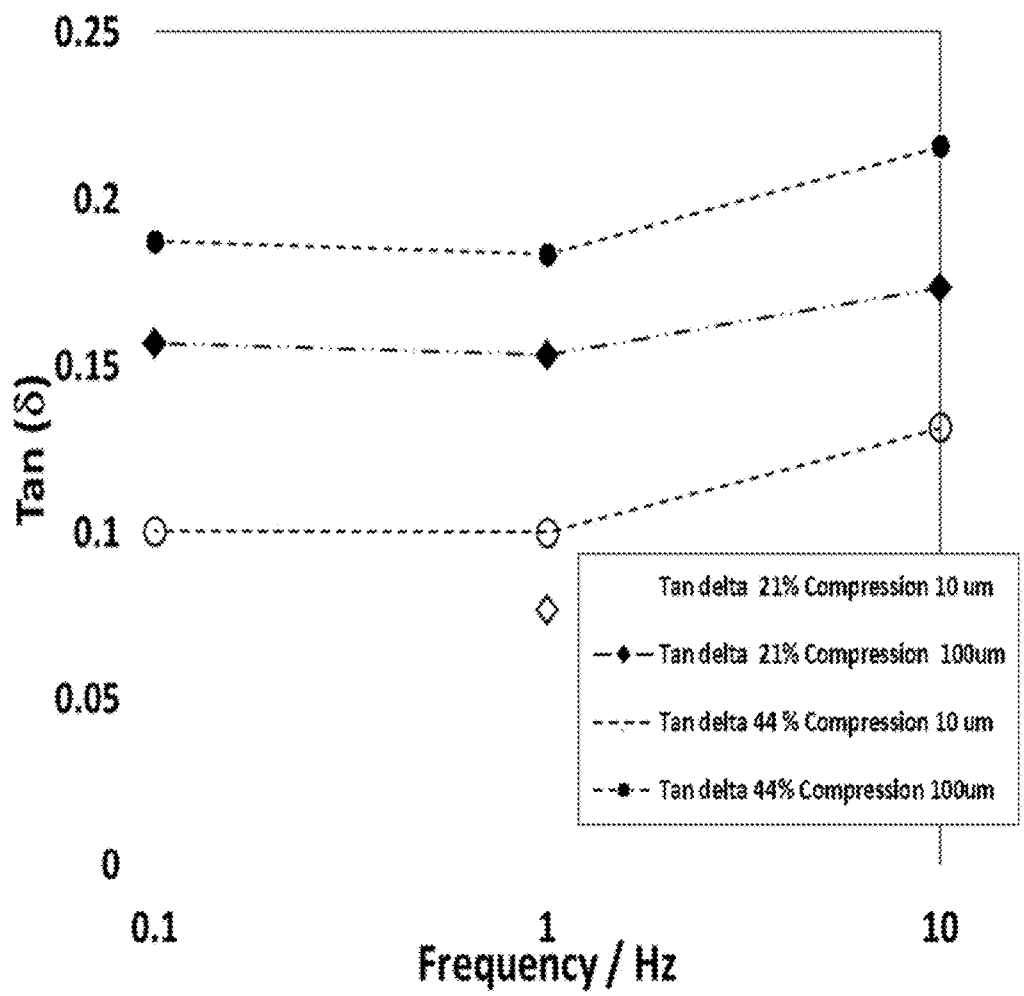
FIG. 9 is a graph illustrating, the damping coefficient vs. frequency of a Ni-7% P micro-lattice with a density ~20 mg/cm$^3$ in a shear DMA test at two different amplitudes and two different pre-compression strains.

For further illustration, FIGS. 6 through 9 illustrate results of dynamic mechanical analysis (DMA) on a sample micro-lattice (such as that illustrated in FIG. 2A). More specifically, FIG. 6 is a graph illustrating the damping coefficient (tan δ) and strain vs. normal force (pre-load) of a "virgin" Ni-7% P micro-lattice with a density=14 mg/cm$^3$ in a compression DMA test at frequency=1 Hz and amplitude=5 μm. Alternatively, FIG. 7 is a graph illustrating the damping coefficient vs. strain of a pre-compressed Ni-7% P micro-lattice with a density=12 mg/cm$^3$ in a compression DMA test at frequency=1 Hz and three different amplitudes. Further, FIG. 8 is a graph illustrating the damping coefficient and shear modulus vs. amplitude of a Ni-7% P micro-lattice with a density ~20 mg/cm$^3$ in a shear DMA test at frequency=1 Hz and two different pre-compression strains. Finally, FIG. 9 is a graph illustrating the damping coefficient vs. frequency of a Ni-7% P micro-lattice with a density ~20 mg/cm$^3$ in a shear DMA test at two different amplitudes and two different pre-compression strains.

DMA measured a damping coefficient (tan δ) of up to 0.22 for nickel micro-lattices (e.g., node-to-node spacing=1 mm, diameter ~150 μm, truss angle=60°, wall thickness=0.3-0.5 μm) in compression and shear. For reference, a typical nickel foam with a relative density between 3 and 4% (density between 0.24-0.32 g/cc) has a loss coefficient of ~0.01-0.02.

As noted above, the micro-lattice also allows for acoustic damping. To demonstrate the acoustic abilities of the micro-lattice, acoustic absorption measurements were performed in a Brüel & Kjær acoustic test tube, with the results depicted in FIG. 10. While micro-lattice materials are fairly transparent to sound waves due to their large and periodic porosity, they can absorb sound well when it is coupled into the structure with a face sheet. Preloading the micro-lattice by compressing the microlattice structure to strains between 3% and 50% increases the absorption coefficient due to increased damping performance as observed in the DMA tests.

Figure 10:
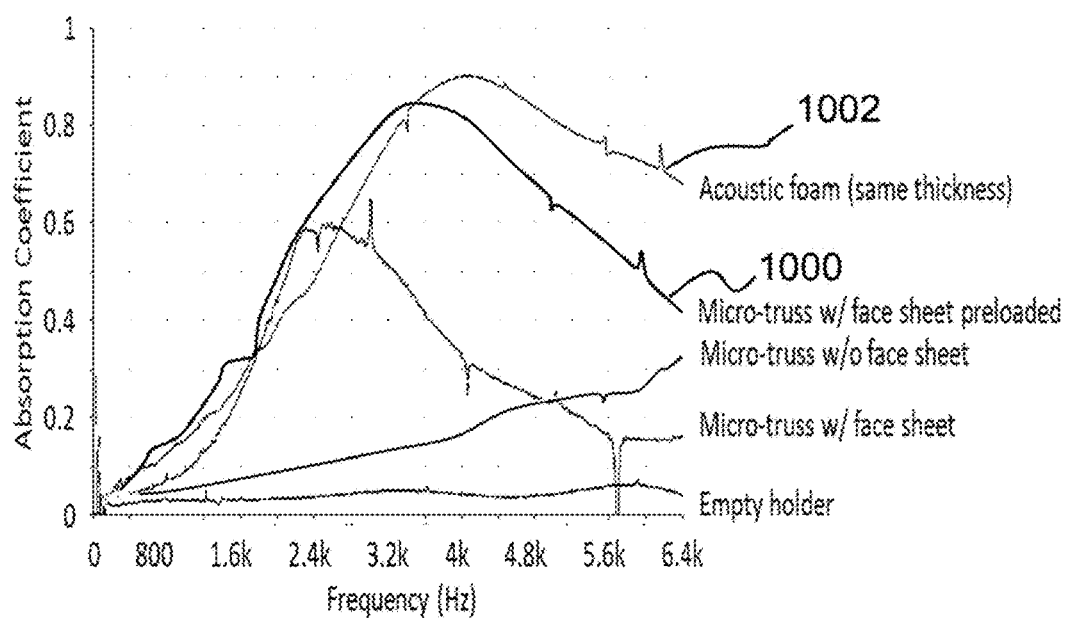
FIG. 10 is a graph illustrating acoustic absorption of micro-lattice compared to acoustic foam.

As shown in FIG. 10, the sound absorption performance of micro-lattices 1000 with a density of 8 mg/cc (having a face sheet and pre-loaded (e.g., partially compressed between two other materials or layers)) is comparable to acoustic foam 1002 of the same thickness with a density of 38 mg/cc across the frequency range measured. For example, the damping material can include the micro-lattice and two other materials or layers (such as the object to be dampened and the constraining layer (as shown in FIG. 12), or two constraining layers that sandwich the micro-lattice therebetween).

Figure 11:
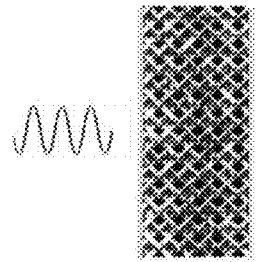
FIG. 11 is an illustration depicting that amplitude selective damping is possible with micro-lattice materials because a threshold stress is necessary to trigger buckling and concomitant energy absorption.
Figure 11:
Figure 11:
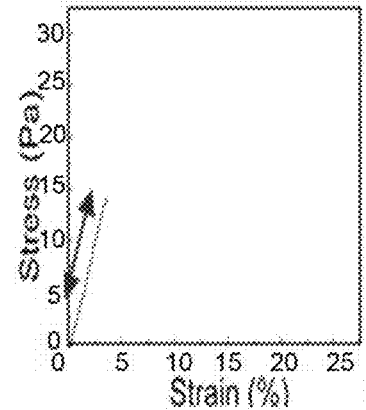
Figure 11:
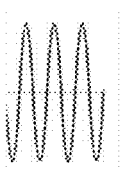
Figure 11:
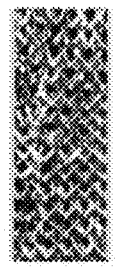
Figure 11:
Figure 11:
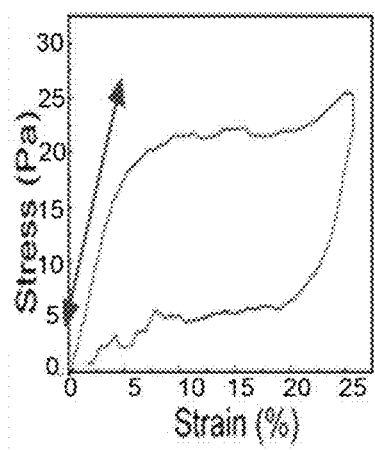

FIG. 11 illustrates the concept of an amplitude sensitive damper based on micro-lattices that require a threshold stress to trigger buckling and energy absorption. For example, the micro-lattice damping material can be used to build an acoustic switch or limiter or a vibration damper that only reacts to large vibrations or shocks/impacts while providing high stiffness and strength under normal operating conditions. In this aspect, the non-linear elastic behavior of the micro-lattice is used. Under low excitation pressure, the material acts linearly and passes most of the acoustic (or vibration) energy. At higher amplitudes the material begins to damp more significantly and shows larger absorption. Thus, the micro-lattice damping material enables amplitude specific damping due to the underlying buckling mechanism that requires a threshold stress to occur. Alternatively, conventional damping materials react to any amplitude.

This aspect could also be used to provide variable absorption as a function of the ambient pressure. Increased bias pressure on the structure will change the absorption properties. Thus, the micro-lattice can be used as a damping material in the walls or components of aircraft or submarines that experience variable bias pressure on structures.

As mentioned earlier, the micro-lattice architecture can be optimized to maximum energy absorption. The cellular architecture can also be tuned to design the appropriate buckling strength depending on the application and loading conditions. For example, the compression and shear properties (modulus and strength) are highly dependent on the lattice member angle. Therefore, for the same material (Ni—P) and density, the lattice member angle can be changed to either increase or decrease the buckling strength. Changing the lattice member angle can be accomplished during the initial formation process by, for example, altering the angle of the collimated UV light as shown in FIG. 3.

Figure 12A:
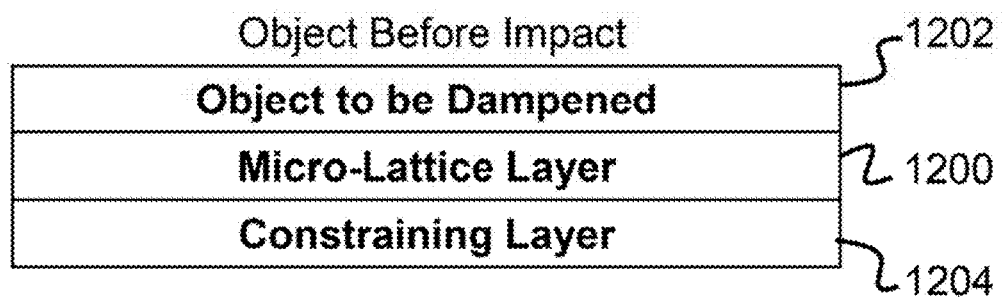
FIG. 12A is an illustration of a constrained-layer damping setup according to the principles of the present invention, depicting the damping setup at rest.
Figure 12B:
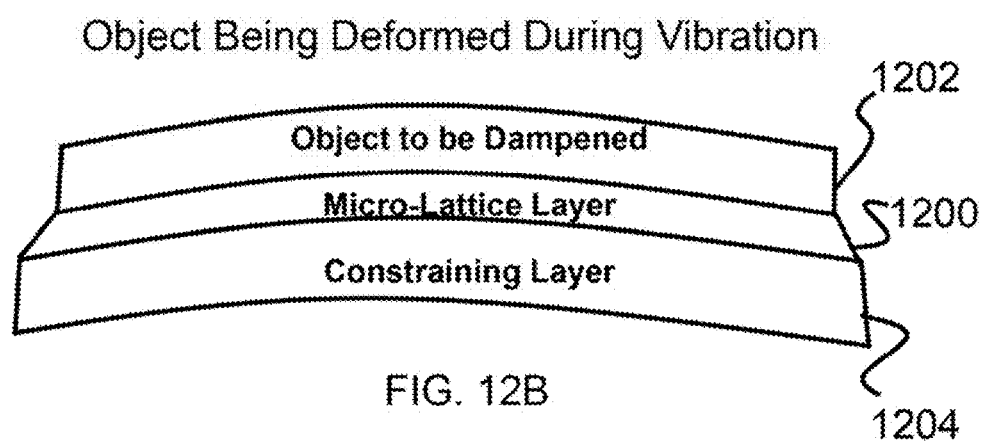
FIG. 12B is an illustration depicting the object to be dampened as being struck, which causes the materials to deform and shear in the middle layer.

FIGS. 12A and 12B shows a constrained layer damper according to the principles of the present invention that can be applied for use in cars, planes, or any other structure that can benefit from damping. Traditional constrained-layer damping is a mechanical engineering technique for suppression of vibration and typically includes a viscoelastic material that is sandwiched between two sheets of stiff materials that lack sufficient damping by themselves. Instead of a viscoelastic layer and as shown in FIGS. 12A and 12B, the viscoelastic layer is replaced with a micro-lattice damping material 1200. Higher stiffness of the micro-lattice damping material 1200 (as compared to viscoelastic materials) result in higher energy absorption. In this example, the micro-lattice layer 1200 is sandwiched between the object to be dampened 1202 and a constraining layer 1204. As noted above, the object to be dampened 1202 is any suitable object that can benefit from damping, such as the exterior of an automobile, the exostructure of a plane, etc. Alternatively, the constraining layer 1204 is any material or layer (e.g., face sheet) that holds the micro-lattice layer 1200 against the object to be dampened 1202. As a non-limiting example, the constraining layer 1204 is a thin sheet of a stiff and strong material (e.g., plastic, metal, etc.) to force the micro-lattice layer 1200 to deform (i.e., shear). It should be understood that although the term micro-lattice "layer" is used, the invention is not intended to be limited to a "layer" as the micro-lattice can be formed in any suitable shape, such as a block, layer, post, etc. Further, the micro-lattice can be attached with or positioned between one or more face sheets (e.g., constraining layers).

A different architecture than measured in the DMA experiment may be desired for a constrained layer damper, specifically a structure that undergoes buckling in shear. The micro-lattice material can potentially provide several advantages to existing viscoelastic polymer based treatments. First, damping can be achieved across a broad temperature range including space and cryogeneic environments (e.g., less than 100 degrees Celsius, etc.) which are currently limited to surface area friction techniques, such as particle damping.

Second, viscoelastic materials with high loss factors are typically very soft. In order to increase the energy absorption of these materials in a panel damping application, a mechanical leverage component such as a spacer block is placed between the panel and the viscoelastic material. This spacer block adds significant volume and mass to the damping treatment. By increasing the modulus of the micro-lattice using the aforementioned architectural parameters, this leverage component may be reduced or eliminated, thereby decreasing the mass and volume of treatments.

As a summary, the use of a micro-lattice damping material provide several advantages over existing damping materials. Several advantages are provided below.

Micro-lattice damping materials can be fabricated from metallic materials and exhibit high damping while retaining metallic properties including electric and thermal conductivity, environmental stability, high temperature capability (e.g., greater than 300 degrees Celsius), high stiffness. For example, nickel micro-lattices have demonstrated a loss coefficient (tan δ)=0.2. For reference, a typical nickel foam with density between 3 and 4% has a loss coefficient of ~0.01-0.02.

As another advantage over the prior art, micro-lattice damping materials can be fabricated from ceramic materials (e.g., oxides, $Si_3N_4$, SiC, diamond) and can be designed to exhibit high damping while also exhibiting properties of the constituent ceramic, including oxidation resistance, corrosion resistance, ultra-high temperature capability, piezoelectricity.

Additionally, metallic or ceramic micro-lattice damping materials can operate in large temperature ranges (e.g. −100 degrees Celsius to 500 Celsius for Ni-7% P, or over ranges greater than 200 degrees Celsius, etc.) in contrast to conventional visco-elastic polymer dampers that are limited to a small temperature range around their glass transition temperature.

Micro-lattice damping materials offer multifunctional opportunities due to their open cellular structure, for example for simultaneous damping and active cooling or heating, damping and energy storage, damping and impact/blast energy absorption, and others.

Further, micro-lattice damping materials can be designed to provide anisotropic damping properties. Selecting a unit cell that is not cubic (in the sense of Bravais lattice theory) typically results in anisotropic mechanical properties. For example, a tetragonal unit cell with a truss angle of 60 degrees (as in one aspect) results in higher stiffness and strength in the longer direction (90 degrees) as compared to the two shorter directions (0 degrees). This anisotropy also affects the damping properties resulting in a higher damping efficiency in the 90 degree direction than in the 0 degree direction. The anisotropy can be increased by changing architectural parameters accordingly, for example, a steeper angle (70 degrees) increases the anisotropy. A material with high damping in one direction and low damping in another direction can be useful for certain applications. This is not possible with conventional solid damping materials, which are isotropic.

Finally, micro-lattice damping Materials are ultra lightweight. For example, metallic Ni-7% P micro-lattices with a density of 0.01 $g/cm^3$ have been demonstrated with a loss coefficient tan δ=0.2 while viscoelastic polymers can achieve loss coefficients close to 1 but have a density around 1 $g/cm^3$, 100× higher than micro-lattices.

What is claimed is:

1. A damping material, comprising:
   a micro-lattice formed of a three-dimensional interconnected network of hollow tubes;
   wherein the hollow tubes are formed of a material having a relatively density in a range of 0.00001 to 0.0005 in relation to the theoretical density of the material and have a wall thickness and a diameter, such that a wall thickness to diameter ratio is on the order of $\varepsilon_y$, wherein $\varepsilon_y$ denotes a yield strain material property of the material forming the hollow tubes; and
   wherein the damping ability is provided by elastic buckling of the hollow tubes and/or nodes where the tubes intersect upon receiving a load, whereby upon removal of that load, the micro-lattice substantially recovers its original shape.

2. The damping material as set forth in claim 1, wherein the hollow tubes are formed of a material selected from a group consisting of metal, ceramic, and a polymer.

3. The damping material as set forth in claim 1, further comprising a constraining layer attached to the micro-lattice, with the micro-lattice being attached with an object to be dampened.

4. The damping material as set forth in claim 1, wherein the micro-lattice includes a damping coefficient (tan δ) that is greater than 0.05.

5. The damping material as set forth in claim 1, wherein the micro-lattice has a density smaller than 0.1 $g/cm^3$.

6. The damping material as set forth in claim 1, further comprising two materials, with the micro-lattice being partially compressed between the two materials such that the micro-lattice is pre-loaded with strain.

7. The damping material as set forth in claim 6, wherein the micro-lattice is preloaded to strains between 3% and 50%.

8. The damping material as set forth in claim 1, wherein the micro-lattice has a density of 10 mg/cm$^3$ or less.

9. The damping material as set forth in claim 1, wherein the micro-lattice operable for damping at temperatures greater than 300 degrees Celsius, lower than negative 100 degrees Celsius, or over temperature range exceeding 200 degrees Celsius.

10. The damping material as set forth in claim 1, wherein the micro-lattice is attached to one or more face sheets.

11. The damping material as set forth in claim 1,
wherein the diameter is between 10 and 1000 microns; and
wherein the wall thickness is between 0.01 and 2 microns.

\* \* \* \* \*